US011374580B2

(12) United States Patent
Mukherjee et al.

(10) Patent No.: US 11,374,580 B2
(45) Date of Patent: Jun. 28, 2022

(54) CHARGE PUMP PHASE LOCKED LOOP WITH LOW CONTROLLED OSCILLATOR GAIN

(71) Applicant: STMicroelectronics International N.V., Geneva (CH)

(72) Inventors: Sagnik Mukherjee, Kolkata (IN); Ankit Gupta, Delhi (IN)

(73) Assignee: STMicroelectronics International N.V., Geneva (CH)

( * ) Notice: Subject to any disclaimer, the term of this patent is extended or adjusted under 35 U.S.C. 154(b) by 0 days.

(21) Appl. No.: 17/381,754

(22) Filed: Jul. 21, 2021

(65) Prior Publication Data

US 2022/0038105 A1     Feb. 3, 2022

Related U.S. Application Data

(60) Provisional application No. 63/058,593, filed on Jul. 30, 2020.

(51) Int. Cl.
    *H03L 7/093*        (2006.01)
    *H03L 7/099*        (2006.01)

(52) U.S. Cl.
    CPC .............. *H03L 7/093* (2013.01); *H03L 7/099* (2013.01)

(58) Field of Classification Search
    CPC ................................ H03L 7/093; H03L 7/099
    USPC ............................................... 331/16, 34, 17
    See application file for complete search history.

(56) References Cited

U.S. PATENT DOCUMENTS

| | | | |
|---|---|---|---|
| 6,054,903 A * | 4/2000 | Fiedler | H03L 7/099 |
| | | | 331/10 |
| 8,503,597 B2 | 8/2013 | Fischette et al. | |
| 8,564,340 B2 | 10/2013 | Liu et al. | |
| 10,454,418 B1 | 10/2019 | Jain et al. | |
| 2010/0090768 A1 * | 4/2010 | Yamazaki | H03L 7/0995 |
| | | | 331/15 |
| 2019/0334530 A1 | 10/2019 | Gupta et al. | |

FOREIGN PATENT DOCUMENTS

KR      1020180131017 A      12/2018

* cited by examiner

*Primary Examiner* — Arnold M Kinkead
(74) *Attorney, Agent, or Firm* — Crowe & Dunlevy

(57) ABSTRACT

A PLL includes a phase-frequency-detector-and-charge-pump-circuit (PFDCPC) receiving a reference signal and divided signal, and generating a charge-pump current. A loop-filter is between output of the PFDCPC and a reference-voltage. A first voltage-to-current converter (V2I1) has low gain, and a second voltage-to-current converter (V2I2) has high gain. A low-gain-path is between outputs of the PFDCPC and V2I1, and a high-gain-path is between the outputs of the PFDCPC and V2I2. A current-controlled-oscillator receives an input signal, and generates an output signal. A loop divider divides the output signal by a divider-value, producing the divided signal. The low-gain-path runs directly from the PFDCPC, through the V2I1, to the input of the current-controlled-oscillator. The high-gain-path runs from the PFDCPC to the loop-filter, from a tap of the loop-filter to a low-pass filter through a current mirror, from a tap of the low-pass filter through the V2I2, to the input of the current-controlled-oscillator.

25 Claims, 7 Drawing Sheets

(State prior to lock)

(State after lock)

CHARGE PUMP PHASE LOCKED LOOP WITH LOW CONTROLLED OSCILLATOR GAIN

RELATED APPLICATION

This application claims priority to U.S. Provisional Application for Patent No. 63/058,593, filed Jul. 30, 2020, the contents of which are incorporated by reference to the maximum extent allowable under the law.

TECHNICAL FIELD

This disclosure is related to the field of phase locked loops and, in particular, to a phase locked loop having a design that permits the voltage controlled oscillator of the phase locked loop to have a high gain at low frequencies but a low gain at high frequencies.

BACKGROUND

Locked loop circuits, such as phase locked loop circuits, are basic components of radio, wireless, and telecommunication technologies. A phase locked loop (PLL) is a control system that generates an output signal having a phase related to the phase of an input signal.

A sample known PLL 1 is now described with reference to FIG. 1. The PLL 1 includes a phase frequency detector 2 (PFD) which compares the phase of an input reference signal Fref to the phase of a feedback signal Fdiv generated by a loop divider 6. The PFD 2 generates a control signal Vctrl for a charge pump 3 that is depending on the relationship between the phases of Fref and Fdiv. The charge pump 3 generates a charge pump current Ip that is filtered by a loop filter 4 to produce a voltage control signal Vc for a voltage controlled oscillator (VCO) 5. The VCO 5 generates an oscillating output signal Fout having a frequency set by the control signal Vc. The loop divider 6 divides the output signal Fout by a divisor value to produce the feedback signal Fdiv.

The control signal Vc causes the VCO 5 to adjust the frequency of the output signal Fout so that the feedback signal Fdiv is locked to the input reference signal Fref in frequency and phase. The feedback signal Fdiv being locked to the input reference signal Fref in phase implies that the output signal Fout is locked to the input reference signal Fref in phase. The feedback signal Fdiv being locked to the input reference signal Fref in frequency also implies that the frequency of the output signal Fvco is equal to the frequency of the input reference signal Fref multiplied by the divisor value currently employed by the loop divider 6. This means that the frequency of the output signal Fout can be a multiple (or fraction) of the frequency of the input reference signal Fref.

While this PLL 1 design is quite useful in a variety of applications, concerns arise with the amount of noise that is present in the output signal Fout. To reduce noise, it is desired to reduce the gain of the VCO 5, thereby allowing for a higher charge pump 3 current and a reduction in loop filter 4 noise. Conventionally, this has been performed by utilizing a VCO that operates in response to a constant current together with a current controlled by a control voltage. This means that the PLL would need to have sufficient gain to cover the temperature spread of the VCO and the noise introduced due to the high frequency of the generation of the output signal and also respond properly to the high-frequency effects in the PLL. This may be sufficient in some applications, but in others, may be insufficient to meet desired performance specifications, for example related to jitter.

As such, further development is required.

SUMMARY

Disclosed herein is a phase locked loop (PLL), including: a phase frequency detector and charge pump (PFDCP) circuit configured to receive a reference signal having a reference frequency and a divided signal having a divided frequency, and to generate a charge pump current based thereupon; a first capacitor selectively coupled between an output of the PFDCP circuit and a reference voltage by a second switch; a loop filter coupled between an output of the PFDCP circuit and the reference voltage; a first voltage to current converter having a low gain; a second voltage to current converter having a high gain; a low gain path between the output of the PFDCP circuit and the first voltage to current converter; a high gain path between the output of the PFDCP circuit and the second voltage to current converter; a current controlled oscillator having an input node receiving an input signal, and generating therefrom an output signal having an output frequency; and a loop divider configured to divide the output signal by a divider value to produce the divided signal.

The low gain path runs from the PFDCP circuit, through the first voltage to current converter, to the input node of the current controlled oscillator. The high gain path includes: a current mirror circuit coupled between a tap of the loop filter and a current mirror output node; a low pass filter coupled between the current mirror output node and the reference voltage; a voltage buffer selectively coupled between the current mirror output node and a tap of the low pass filter by a first switch; a third switch coupled between the tap of the low pass filter and an input of the second voltage to current converter; and a fourth switch coupled between an input of the second voltage to current converter and the input of the first voltage to current converter. A controller is configured to set the first, second, third, and fourth switches to one configuration prior to the PLL achieving lock, and to set the first, second, third, and fourth switches after the PLL has achieved lock.

Also disclosed herein is a method of operating a locked loop (LL). The method includes: when the LL is in an unlocked condition, shorting inputs of a high gain path and a low gain path to one another such that a charge pump voltage is applied to inputs of first and second voltage to current converters to thereby cause application of a combined gain of the first and second voltage to current converters to the charge pump voltage, producing an amplified charge pump voltage; controlling an oscillator based upon the amplified charge pump voltage so that the oscillator generates an output signal; dividing the output signal by a loop division amount to produce a frequency divided signal; adjusting the charge pump voltage based upon a comparison between the frequency divided signal and a reference signal such that a frequency of the frequency divided signal is equal to a frequency of the reference signal; and when the LL is in a locked condition, removing the short between the inputs of the high gain path and the low gain path such that the charge pump voltage is directly applied to the input of the first voltage to current converter but is filtered and applied to the input of the second voltage to current converter.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein. Note that herein, when "ground" or "ground voltage" is used, any suitable reference voltage (that may not be ground) may instead be used.

Figure 1:
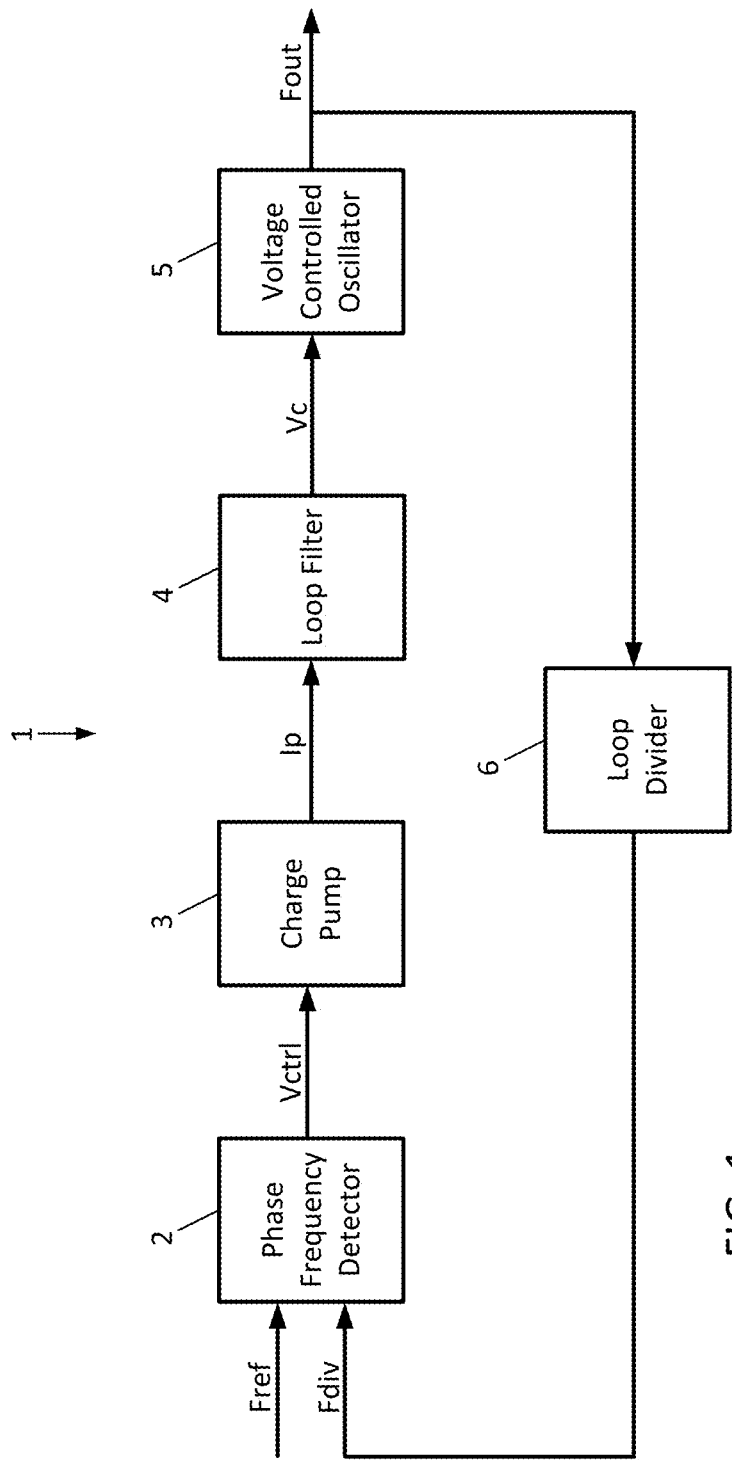
FIG. 1 is a block diagram of a prior art phase locked loop.
Figure 2A:
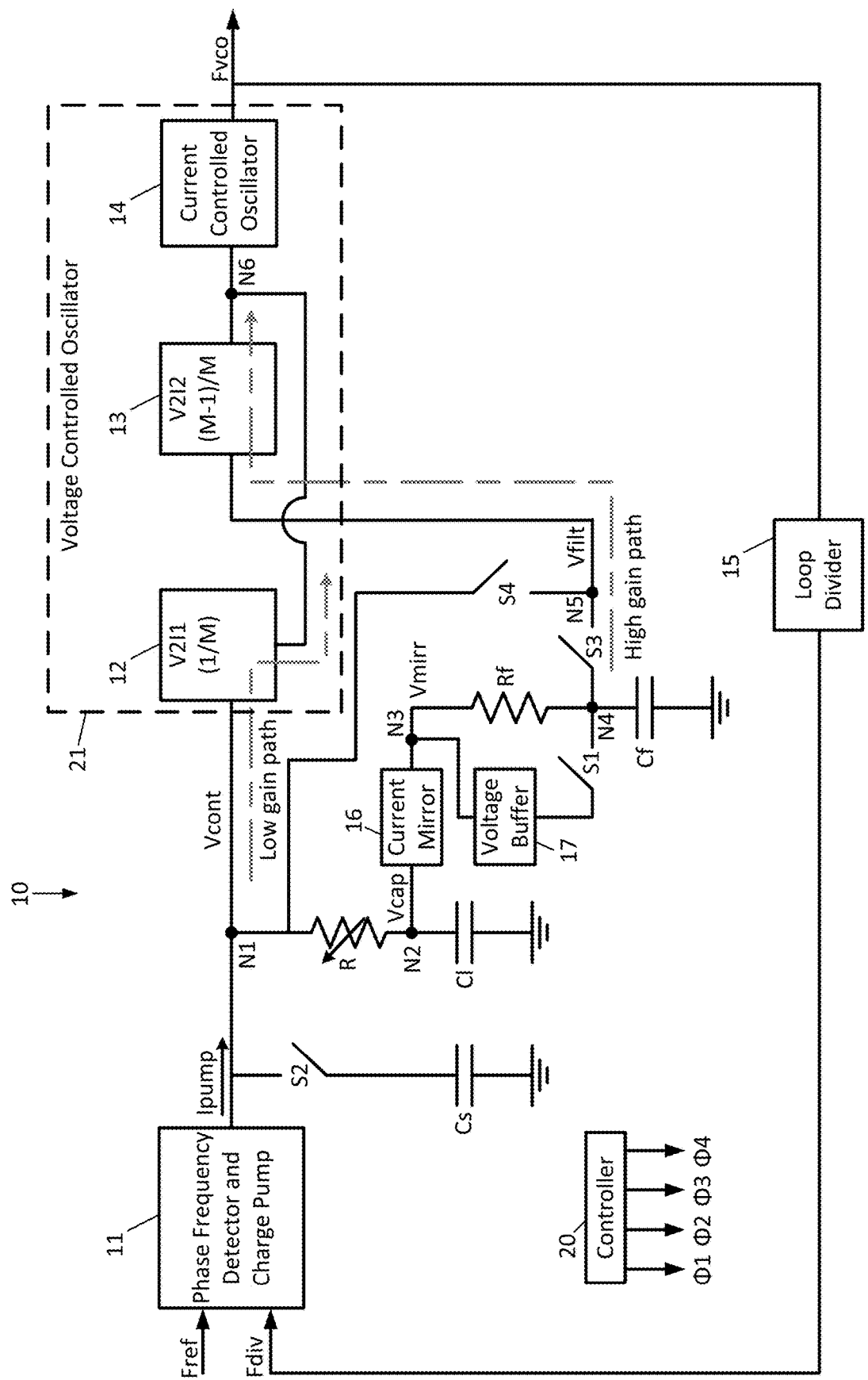
FIG. 2A is a schematic block diagram of a phase locked loop disclosed herein.

Now described with reference to FIG. 2A is a phase locked loop 10 arranged to provide its voltage controlled oscillator (VCO) 21 with a high gain at low frequencies of change of the PLL loop parameters (e.g., input phase error, charge pump current, VCO control voltage, etc) but a low gain at high frequencies of change of the PLL loop parameters. Note that the VCO 21 does not include, and is devoid of, an internal digital to analog converter (DAC).

The PLL 10 includes a phase frequency detector and charge pump circuit 11 that receives a reference signal having a reference frequency Fref and a feedback signal having a divided frequency Fdiv as input. The phase frequency detector and charge pump circuit 11 outputs a charge pump output current Ipump to node N1 to charge capacitor C1 through adjustable resistor R to thereby generate a voltage Vcont at node N1. Note here that it is assumed that the adjustable resistor R may have one of two resistance values—one resistance value before lock, and one resistance value after lock. Additionally, the phase frequency detector and charge pump circuit 11 is selectively connected to the capacitor Cs by switch S2.

The VCO 21 is formed by a first voltage to current converter (V2I1) 12, a second voltage to current converter (V2I2) 13, and a current controlled oscillator (CCO) 14. The first voltage to current converter (V2I1) 12 has an input coupled to node N1, applies a gain of 1/M times the combined gain of the V2I1 12 and the second voltage to current converter (V2I2) 13 to the control signal Vcont, and has an output coupled to node N6. The output of the V2I1 12 is a current having a magnitude that is a function of the level of the voltage Vcont and the gain of the V2I1 12. The second voltage to current converter (V2I2) 13 has an input coupled to receive a voltage Vfilt generated at node N5, applies a gain of (M−1)/M times the combined gain of the V2I1 12 and the V2I2 13, and has an output coupled to node N6. The output of the V2I2 13 is a current having a magnitude that is a function of the level of the voltage Vfilt and the gain of the V2I2 13. The CCO 14 has an input connected to node N6 to receive the currents generated by V2I1 12 and V2I2 13 and provides its output signal as having a frequency Fvco that is dependent on the magnitudes of the received currents. The output signal from the CCO 14 is then divided by the loop divider 15 to produce the feedback signal having the feedback frequency Fdiv.

The capacitor Cs is selectively coupled between the output of the phase frequency detector and charge pump circuit 11 and a reference voltage (e.g., ground) by the switch S2. The capacitor Cs serves to filter out ripple in the charge pump voltage Vcont. A loop filter is formed by an adjustable resistor R connected between nodes N1 and N2, and a capacitor C1 connected between node N2 and the reference voltage. A voltage Vcap forms at node N2, and is received by a current mirror 16 as input. The current mirror 16 generates its output as the mirrored voltage Vmirr at node N3. A low-pass filter is formed by a resistor Rf coupled between node N3 and N4 and a capacitor Cf coupled between node N4 and the reference voltage. A voltage buffer 17 (for example, an operational amplifier in a unity gain configuration) has an input coupled to node N3 and an output selectively coupled to node N4 by switch S1. Node N4 is selectively coupled to node N5 by switch S3. Node N5 is selectively coupled to node N1 by switch S4. A filtered voltage Vfilt is formed at node N5 and is dependent upon the position of the switches S1, S2, S3, and S4.

Figure 2B:
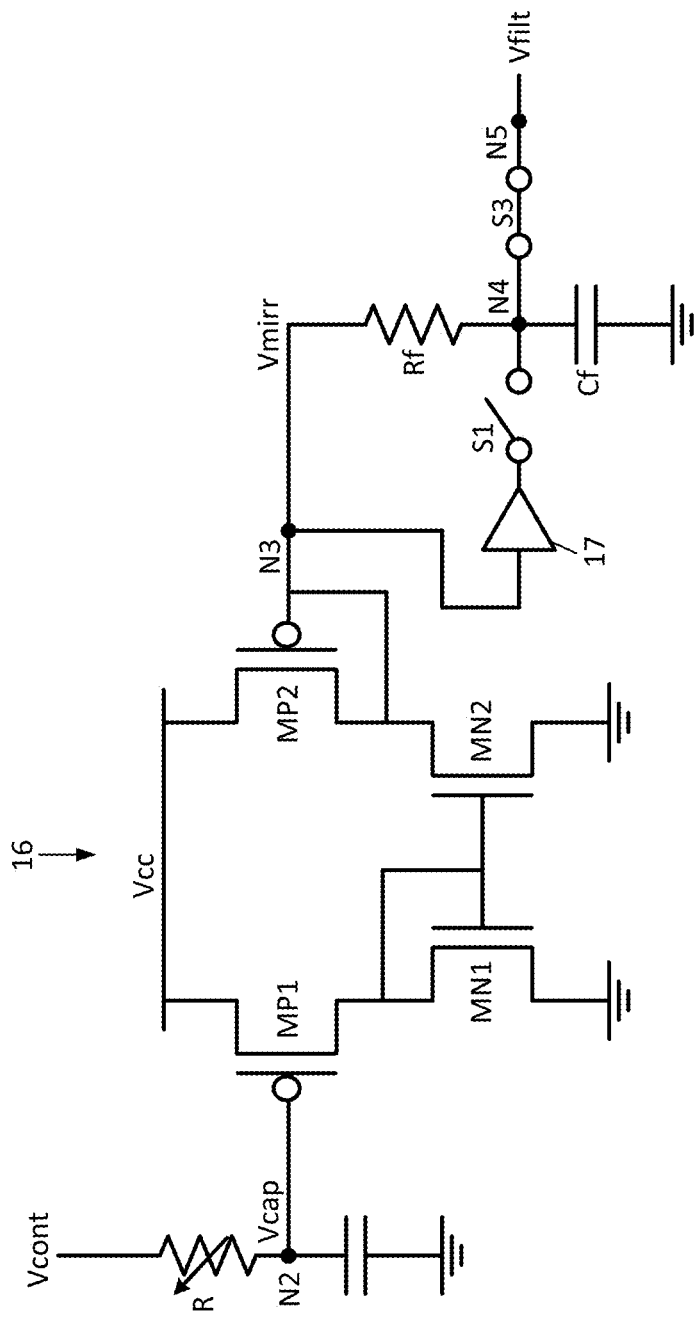
FIG. 2B is a schematic diagram of the current mirror and voltage buffer of the phase locked loop of FIG. 2A.

Refer now to FIG. 2B, where specifics of the current mirror 16 and voltage buffer 17 can be seen. The current mirror 16 is comprised of: a first p-channel transistor MP1 having a source coupled to a supply voltage Vcc, a drain coupled to a drain of a first n-channel transistor MN1, and a gate coupled to node N2 to receive the voltage Vcap; a first n-channel transistor MN1 having a drain coupled to the drain of the first p-channel transistor MP1, a source coupled to the reference voltage, and a gate coupled to the drain of the first n-channel transistor MN1; a second p-channel transistor MP2 having a source coupled to the supply voltage Vcc, a drain coupled to a drain of a second n-channel transistor MN2, and a gate coupled to the drain of the second p-channel transistor MP2 as well as to node N3 to produce the mirrored voltage Vmirr; and a second n-channel transistor MN2 having a drain coupled to the drain of the second p-channel transistor MP2, a source coupled to the reference voltage, and a gate coupled to the gate of the first n-channel transistor MN1. In operation, the transistor MP1 operates as a voltage controlled current source, while the transistors MN1 and MN2 mirror the current generated by the transistor MP1 to produce an output current that is converted by the transistor MP2 to the mirrored voltage Vmirr. The size ratio of the transistors MN1:MN2 sets the scaled relationship between the voltages Vcap and Vmirr, and is preferably kept equal to that of MP1:MP2 so that Vmirr follows Vcap.

The voltage buffer 17 is comprised of a buffer (for example, an operational amplifier in a unity gain configuration) receiving the mirrored voltage Vmirr as input and selectively providing output to node N4 depending upon the position of the switch S1.

Referring back to FIG. 2A, note that the path from the output of the phase frequency detector and charge pump 11 through V2I1 12, and into the CCO 14 is a low gain path, where the gain of the V2I1 12 is 1/M times the total gain of the V2I1 12 and the V2I2 13. Conversely, the path from the output of the phase frequency detector 11 through the adjustable resistor R, through the current mirror 16, through the resistor Rf, through the switch S3 to the V2I2 13, and into the CCO 14 is a high gain path, where the gain of the V2I2 13 is (M−1)/M times the total gain of V2I1 12 and V2I2 13.

Figure 3A:
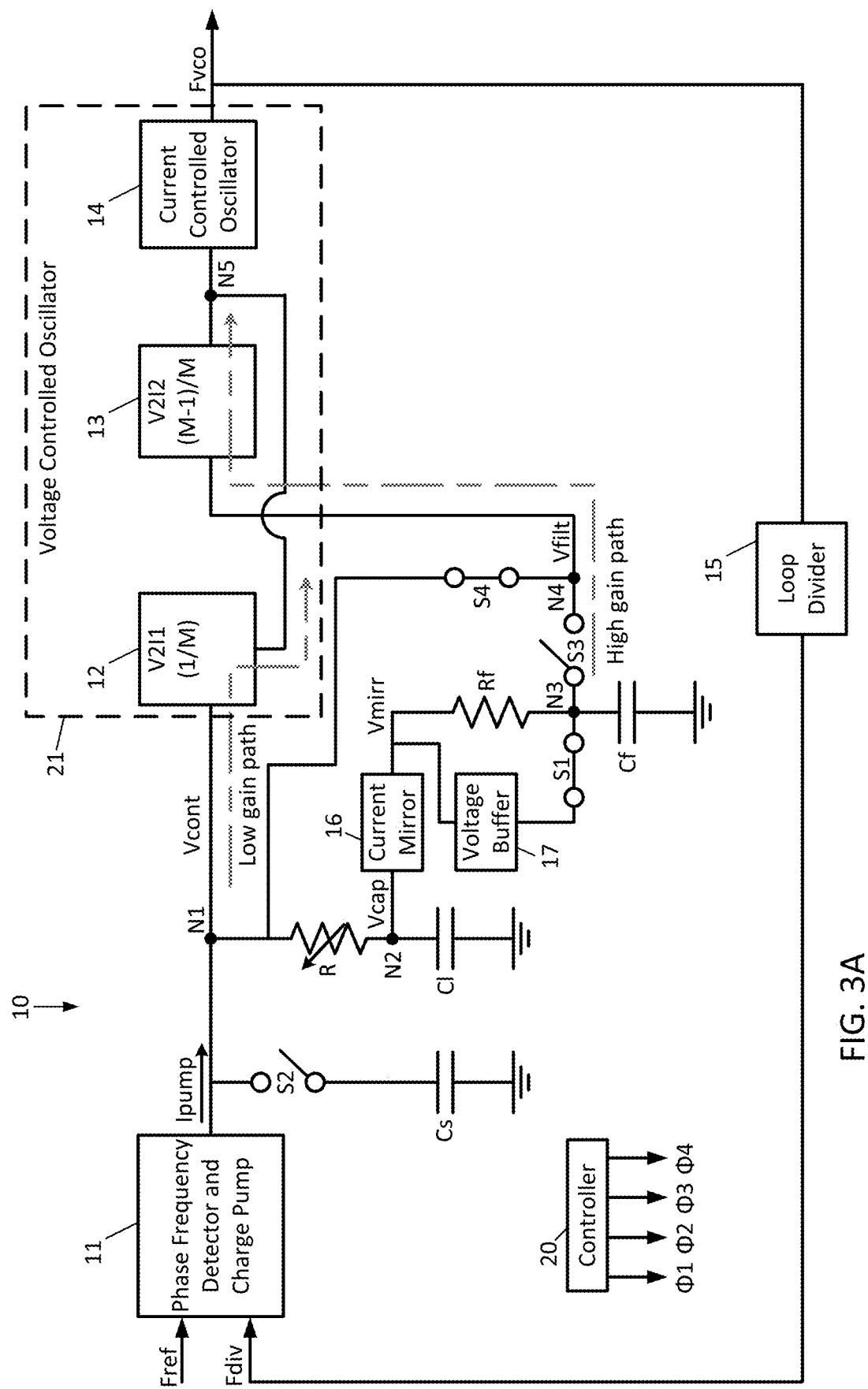
FIG. 3A is the schematic block diagram of the phase locked loop of FIG. 2A, illustrating the position of the switches while seeking lock.
Figure 3B:
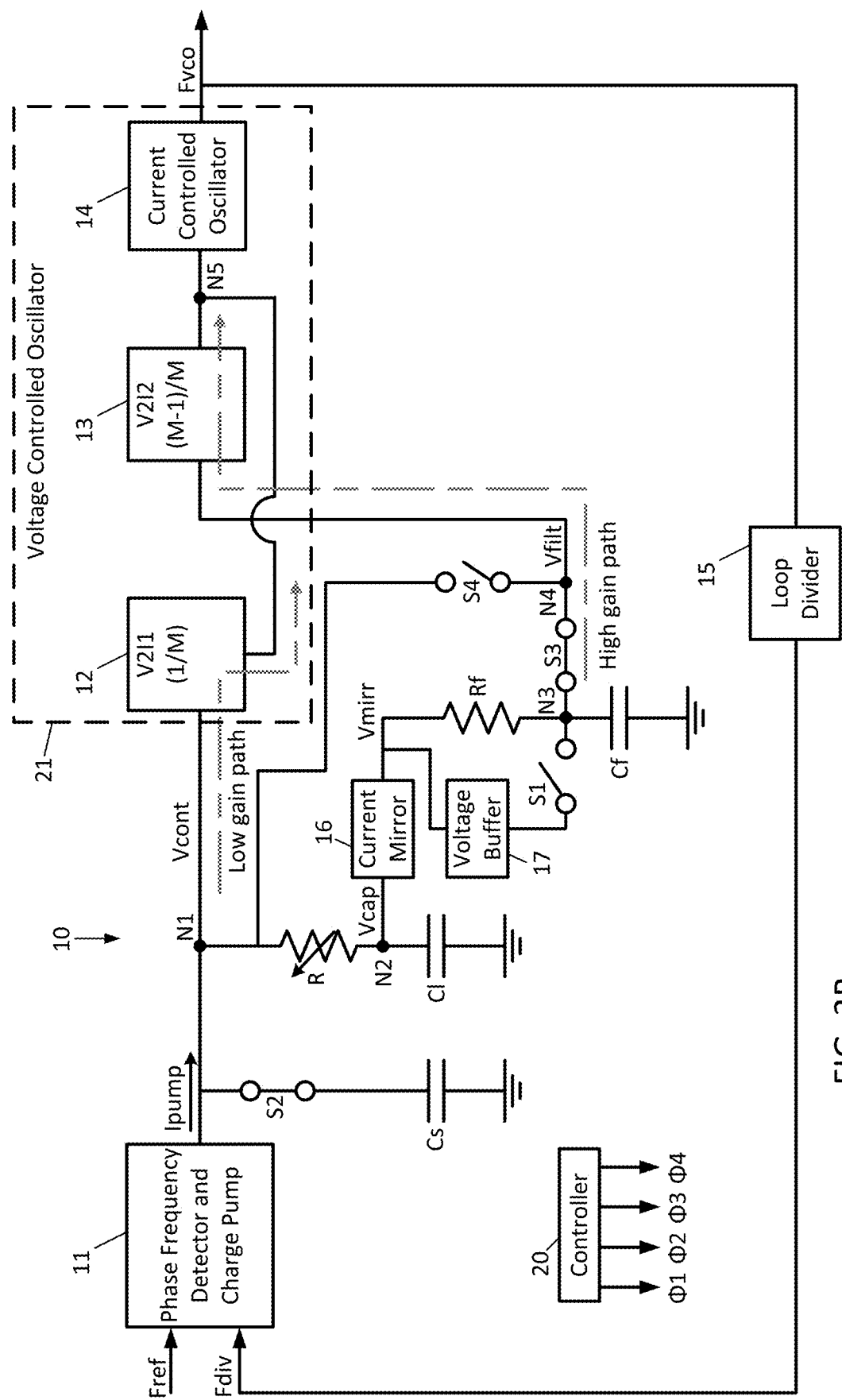
FIG. 3B is the schematic block diagram of the phase locked loop of FIG. 2A, illustrating the position of the switches once lock has been achieved.

In operation, prior to lock, as can be seen in FIG. 3A, a controller 20 generates control signals ϕ1, ϕ2, ϕ3, and ϕ4 for the switches S1, S2, S3, and S4 such that switches S2 and S3 are open and switches S1 and S4 are closed. Switch S2 being open helps improve the stability of the PLL 10 prior to lock, and switch S3 being open removes the effect of the filter formed by Rf and Cf from the high gain path prior to lock. Switch S4 being closed has the effect of shorting the inputs of the first and second voltage to current converters 12 and 13 together applying the combined gain of the V2I1 12 and the V2I2 13 to the charge pump voltage Vcont (because the inputs to the low gain path and the high gain path are shorted), and the loop filter formed from resistor R and capacitor C1 acts as a first order filter due to the low-pass filter formed by resistor Rf and capacitor Cf not being connected to the input of either of the voltage to current converters 12 and 13. Note that the switch S1 being closed helps to speed up settling, and that prior to lock, the resistance of the resistor R and the charge pump current Ipump can be adjusted by the controller 20, to help ensure sufficiently good stability of the phase locked loop 10.

Once PLL lock is achieved (meaning that Fdiv is equal to and in phase with Fref, and therefore Fvco is equal to Fref multiplied by the loop divider value), switches S1 and S4 are opened and switches S2 and S3 are closed. This way, the inputs to the low gain path and high gain path are no longer shorted.

Therefore, with the PLL 10 described herein, at low frequencies (below the cutoff frequency of the low-pass filter formed by Rf and Cf), the voltages Vfilt and Vcont operate the same way, with temperature drift being tracked by Vfilt. However, since node N4 is a slow node due to the low-pass filter formed by Rf and Cf, the voltage Vfilt acts as the input to the V2I2 13 and Vcont acts as the input to the V2I1 12, providing high VCO gain at low frequencies but low VCO gain at high frequencies. Note again that when low and high frequencies are referred to here, the frequency meant is the frequency of change of the PLL loop parameters, such as input phase error, charge pump current, VCO control voltage, etc.

A discussion of the values of the components within the loop filter and the low-pass filter will now occur, so refer back to FIG. 2B. The values of Rf and Cf are set such that the pole (1/RfCf) and additional zero (M/RfCf) formed are inside the bandwidth of the PLL 10. In addition, the value of Cf may be kept less than the value of Cl, in order to save area. In addition, if desired, Cf can be kept large while Rf is kept small to reduce noise.

The transfer function of the PLL 10 can be mathematically represented by:

$$G(s) = \frac{I_{pump}}{2\pi N} \cdot \left[\frac{\{s^2 R R_F C_F C_L + s(R_F C_F + R C_F + R C_L) + 1\}}{s(C_F + C_L + s R_F C_F C_L)} \cdot \frac{K_{VCO}}{Ms} + \frac{1}{s(C_F + C_L + s R_F C_F C_L)} \cdot \frac{(M-1)K_{VCO}}{Ms}\right] =$$

$$\frac{I_{pump}}{2\pi N} \cdot \frac{K_{VCO}}{s^2 C_L} \left[\frac{\left\{s^2\left(\frac{R R_F C_F C_L}{M}\right) + s\left(\frac{R_F C_F + R C_L}{M}\right) + 1\right\}}{(1 + s R_F C_F)}\right]$$

(for typical $R_F$ and $C_F$ values) =

$$\frac{-I_{pump}}{2\pi N} \cdot \frac{K_{VCO}}{s^2 C_L} \left[\frac{\left(1 + \frac{s}{\omega_{Z1}}\right)\left(1 + \frac{s}{\omega_{Z2}}\right)}{\left(1 + \frac{s}{\omega_{P3}}\right)}\right]$$

If the two zeros products are set to be spaced apart (e.g., $\omega_{P3}$ and $\omega_{Z1}$ are $<<<\omega_{Z2}$) then $\omega_{P3}=1/\text{RfCf}$, $\omega_{Z1}=\text{M/RfCf}$, and $\omega_{Z2}=1/\text{RCl}$, where $\omega_{P3}$ is a low-frequency extra pole, $\omega_{Z1}$ is a low-frequency extra zero, and a)$_{Z2}$ remains the same as in a conventional PLL.

To calculate the unity gain bandwidth (UGB) of the PLL 10 where:

$$\omega_{UGB} >> \omega_{Z2} >> \omega_{Z1},$$

then:

$$\frac{I_{pump}}{2\pi N} \cdot \frac{K_{VCO}}{\omega UGB^2 C_L} \left[\frac{\left(\frac{\omega UGB}{\omega_{Z1}}\right)\left(\frac{\omega UGB}{\omega_{Z2}}\right)}{\left(\frac{\omega UGB}{\omega_{P3}}\right)}\right] = 1.$$

Therefore:

$$\omega_{UGB} = \frac{I_{pump} K_{VCO} R}{2\pi NM} = \frac{\omega UGB, Conv}{M},$$

where $\omega_{UGB}$, Conv is the UGB of a conventional PLL with a VCO gain of Kvco.

To restore the UGB, either Ipump can be multiplied by M, or the value of R can be multiplied by M and the value of Cl can be multiplied by 1/M.

The low frequency gain of the PLL 10 is:

$$\frac{I_{CP}}{2\pi N} \cdot \frac{K_{VCO}}{s^2 C_L}$$

Figure 4:
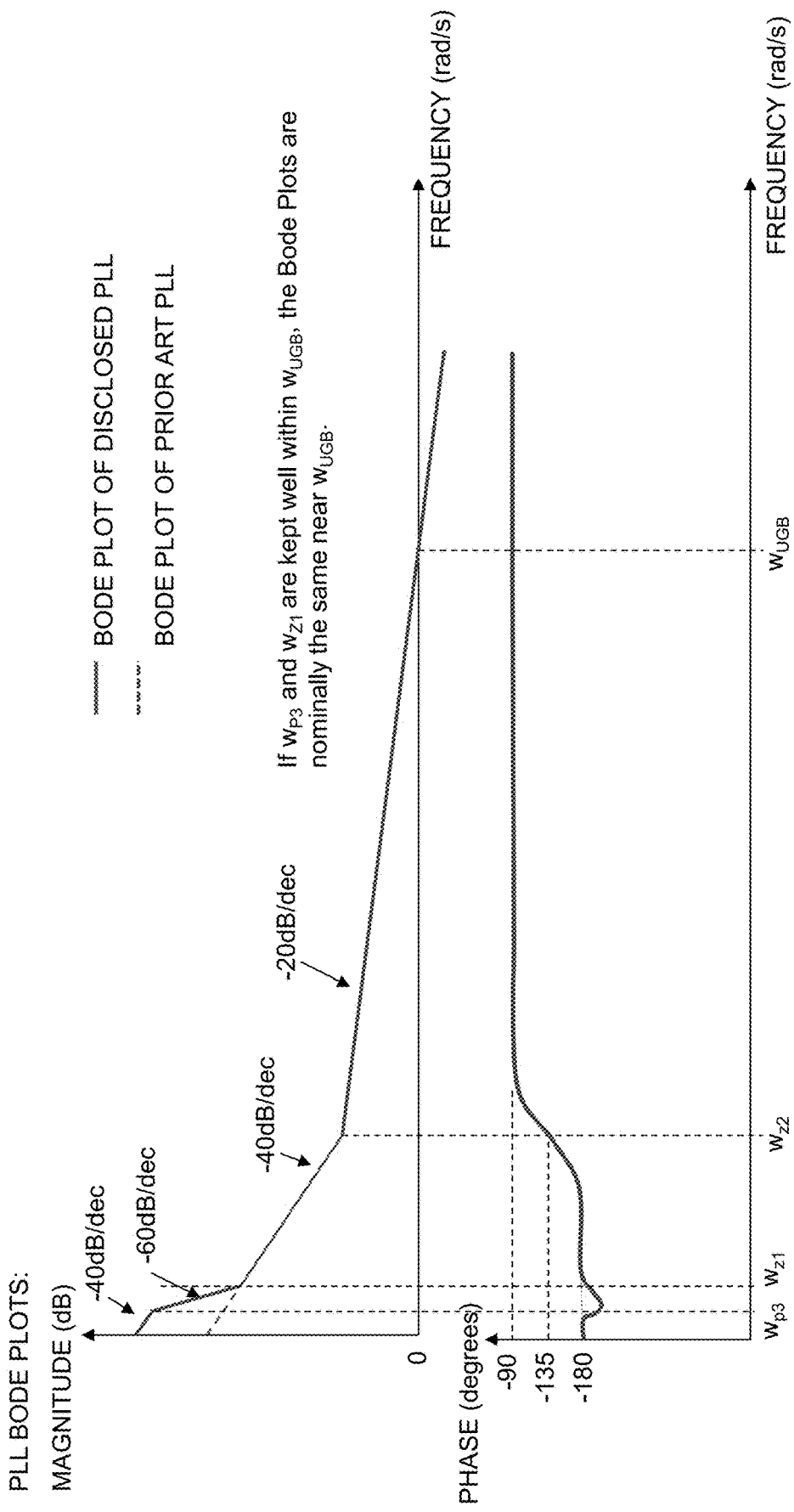
FIG. 4 is a graph showing Bode plots of the phase locked loop disclosed herein as compared to that of a prior art phase locked loop.

With this PLL 10, a low frequency loop gain of M times that of a conventional PLL is achieved, while at high frequencies near the UGB, the loop transfer function is similar to that of a conventional PLL, which can be seen in the Bode plots of FIG. 4.

In addition, this PLL 10 design permits a low splitting factor of 1/M, and the high-frequency effects in the PLL 10 (that are to be corrected by the low gain path) as well as the parasitic capacitance on the input of the VCO 21 set the limit in the splitting of the gain between the low gain path and the high gain path. If, for example, a splitting of 1/10 is to be performed (and therefore, M is 10), advantages over prior art PLLs implementing VCO gain splitting of ½ include the VCO gain at high frequency being reduced (for example by 5 times) without affecting the dynamics of the PLL 10, resulting in the area and loop filter noise being reduced. In addition, advantages over the prior art PLLs also include the increase of the charge pump current without negative affecting other PLL parameters, reducing charge pump noise and loop filter noise. Moreover, this design of PLL 10 eliminates the need for a DAC in the VCO 21, further saving area and improving VCO performance parameters.

Figure 5:
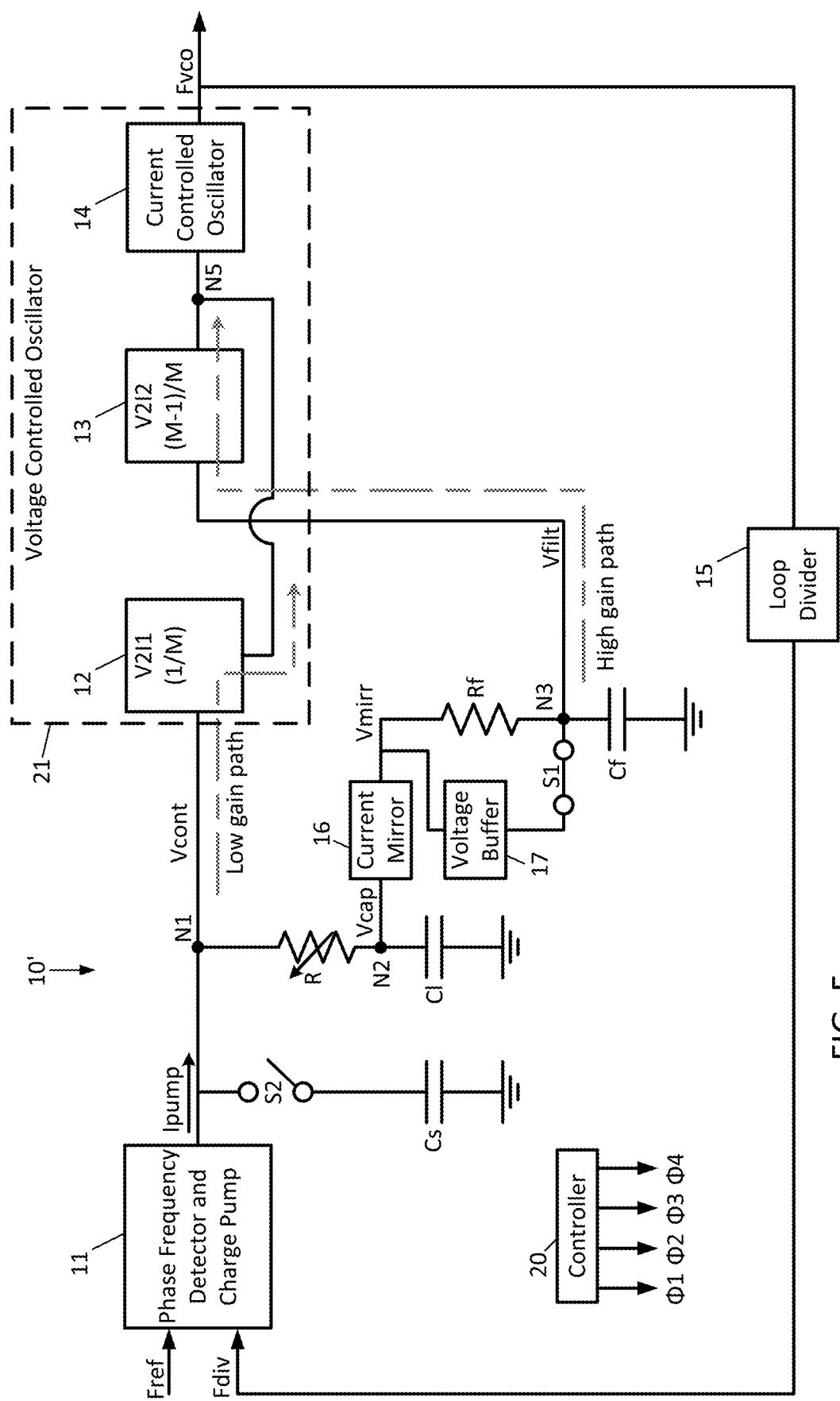
FIG. 5 is a schematic block diagram of an alternate embodiment of the phase locked loop of FIG. 2A.

Referring back to FIG. 2A, it should be understood that in some applications, the switch S3 can be kept closed at all times while the switch S4 can be kept open at all times. In the case where S3 is kept closed at all times and S4 is kept open at all times, the magnitude of Ipump and the resistance of the resistor R are changed so as to maintain loop stability. Note that lock time between both configurations is similar. Note therefore the variant of the PLL 10' shown in FIG. 5 where switch S4 has been eliminated and switch S3 has been replaced by a short. In this instance where switch S3 is always closed and S4 is always open prior to lock, the adjustable resistance R is to be M times that of the R used for the case where S3 and S4 are both present and operate as described above. The magnitude of the current Ipump typically remains the same for both use cases.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A phase locked loop (PLL), comprising:
   a phase frequency detector and charge pump (PFDCP) circuit configured to generate a charge pump current based upon a reference signal having a reference frequency and a divided signal having a divided frequency;
   a first capacitor selectively coupled between an output of the PFDCP circuit and a reference voltage by a second switch;
   a loop filter coupled between an output of the PFDCP circuit and the reference voltage;
   a first voltage to current converter having a low gain;
   a second voltage to current converter having a high gain;
   a low gain path between the output of the PFDCP circuit and the first voltage to current converter;
   a high gain path between the output of the PFDCP circuit and the second voltage to current converter;
   a current controlled oscillator having an input node receiving an input signal, and generating therefrom an output signal having an output frequency;
   a loop divider configured to divide the output signal by a divider value to produce the divided signal;
   wherein the low gain path runs from the PFDCP circuit through the first voltage to current converter to the input node of the current controlled oscillator;
   wherein the high gain path comprises:
      a current mirror circuit coupled between a tap of the loop filter and a current mirror output node;
      a low pass filter coupled between the current mirror output node and the reference voltage;
      a voltage buffer selectively coupled between the current mirror output node and a tap of the low pass filter by a first switch;
      a third switch coupled between the tap of the low pass filter and an input of the second voltage to current converter; and
      a fourth switch coupled between an input of the second voltage to current converter and an input of the first voltage to current converter; and
   a controller configured to set the first, second, third, and fourth switches to one configuration prior to the PLL achieving lock, and to set the first, second, third, and fourth switches to another configuration after the PLL has achieved lock.

2. The PLL of claim 1, wherein the controller closes the first and fourth switches prior to the PLL achieving lock, and opens the second and third switches prior to the PLL achieving lock.

3. The PLL of claim 2, wherein the controller opens the first and fourth switches after the PLL achieves lock, and closes the second and third switches after the PLL achieves lock.

4. The PLL of claim 1, wherein the controller maintains the third switch as closed both before and after the PLL achieves lock, and wherein the controller maintains the fourth switch as open both before and after the PLL achieves lock.

5. The PLL of claim 4, wherein the controller closes the first switch prior to the PLL achieving lock, and opens the second switch prior to the PLL achieving lock.

6. The PLL of claim 5, wherein the controller opens the first switch after the PLL achieves lock, and closes the second switch after the PLL achieves lock.

7. The PLL of claim 1, wherein the loop filter comprises a resistor and capacitor coupled in series between the output of the PFDCP circuit and the reference voltage, with a tap between the resistor and capacitor being coupled to an input of the current mirror circuit.

8. The PLL of claim 7, wherein the resistor of the loop filter comprises an adjustable resistor.

9. The PLL of claim 1, wherein the low pass filter of the high gain path comprises a resistor and capacitor coupled in series between the current mirror output node and the reference voltage, with a tap between the resistor and capacitor being coupled to the third switch.

10. The PLL of claim 1, wherein the current mirror circuit comprises:
    a first transistor having a source coupled to a supply voltage, a gate coupled to the tap of the loop filter, and a drain;
    a second transistor having a drain coupled to the drain of the first transistor, a source coupled to the reference voltage, and a gate coupled to the drain of the second transistor;
    a third transistor having a drain coupled to the current mirror output node, a source coupled to the reference voltage, and a gate coupled to the gate of the second transistor; and
    a fourth transistor having a source coupled to the supply voltage, a drain coupled to drain of the third transistor, and a gate coupled to the drain of the fourth transistor.

11. The PLL of claim 1, wherein the first voltage to current converter has a gain of 1/M times a combined gain of the first and second voltage to current converters; and wherein the second voltage to current converter has a gain of (M−1)/M times the combined gain of the first and second voltage to current converters.

12. A phase locked loop (PLL), comprising:
    a phase frequency detector and charge pump (PFDCP) circuit configured to generate a charge pump current based upon a reference signal having a reference frequency and a divided signal having a divided frequency;
    a loop filter coupled between an output of the PFDCP circuit and a reference voltage;
    a first voltage to current converter having a low gain;
    a second voltage to current converter having a high gain;
    a low gain path between the output of the PFDCP circuit and the first voltage to current converter;
    a high gain path between the output of the PFDCP circuit and the second voltage to current converter;

a current controlled oscillator having an input node receiving an input signal, and generating therefrom an output signal having an output frequency; and a loop divider configured to divide the output signal by a divider value to produce the divided signal;

wherein the low gain path runs directly from the PFDCP circuit, through the first voltage to current converter, to the input node of the current controlled oscillator; and wherein the high gain path runs from the PFDCP circuit to the loop filter, from a tap of the loop filter to a low pass filter, from a tap of the low pass filter through the second voltage to current converter, to the input node of the current controlled oscillator.

13. The phase locked loop of claim 12, further comprising a switch configured to close to short an input of the first voltage to current converter to an input of the second voltage to current converter prior to the PLL achieving lock and then to open once the PLL achieves lock.

14. The PLL of claim 12, wherein the first voltage to current converter has a gain of 1/M times a combined gain of the first and second voltage to current converters; and wherein the second voltage to current converter has a gain of (M−1)/M times the combined gain of the first and second voltage to current converters.

15. The PLL of claim 12, further comprising a switch configured to close to couple the output of the PFDCP circuit to the reference voltage through a capacitor once the PLL achieves lock and to be open prior to the PLL achieving lock.

16. The PLL of claim 12, wherein the loop filter comprises a resistor and capacitor coupled in series between the output of the PFDCP circuit and the reference voltage, with a tap between the resistor and capacitor being coupled to the low pass filter through a current mirror circuit.

17. The PLL of claim 16, wherein the resistor of the loop filter comprises an adjustable resistor.

18. The PLL of claim 16, further comprising a current mirror coupled between the tap between the resistor and capacitor of the loop filter, and the low pass filter.

19. The PLL of claim 18, further comprising a voltage buffer coupled between an output of the current mirror and the tap of the low pass filter.

20. A method of operating a locked loop, the method comprising:

when the locked loop is in an unlocked condition, shorting inputs of a high gain path and a low gain path to one another such that a charge pump voltage is applied to inputs of first and second voltage to current converters to thereby cause application of a combined gain of the first and second voltage to current converters to the charge pump voltage and produce an amplified charge pump voltage;

controlling an oscillator based upon the amplified charge pump voltage so that the oscillator generates an output signal;

dividing the output signal by a loop division amount to produce a frequency divided signal;

adjusting the charge pump voltage based upon a comparison between the frequency divided signal and a reference signal such that a frequency of the frequency divided signal is equal to a frequency of the reference signal; and when the locked loop is in a locked condition, removing the short between the inputs of the high gain path and the low gain path such that the charge pump voltage is directly applied to the input of the first voltage to current converter but is filtered and applied to the input of the second voltage to current converter.

21. The method of claim 20, wherein the filtering of the charge pump voltage is performed by coupling the charge pump voltage to the input of the second voltage to current converter through a low pass filter.

22. The method of claim 20, wherein the combined gain of the first and second voltage to current converters is equal to $$\frac{1}{M} * \frac{(M-1)}{M}.$$

23. The method of claim 20, further comprising, when the locked loop is in the locked condition, filtering ripple in the charge pump voltage.

24. The method of claim 23, wherein the ripple in the charge pump voltage is filtered by coupling a capacitor between the input of the first voltage to current converter and ground.

25. The method of claim 20, further comprising adjusting the charge pump voltage based upon the comparison between the frequency divided signal and the reference signal such that the frequency divided signal and the reference signal are locked in phase to one another.

* * * * *